US006187675B1

(12) United States Patent
Buynoski

(10) Patent No.: US 6,187,675 B1
(45) Date of Patent: Feb. 13, 2001

(54) METHOD FOR FABRICATION OF A LOW RESISTIVITY MOSFET GATE WITH THICK METAL SILICIDE ON POLYSILICON

(75) Inventor: Matthew S. Buynoski, Palo Alto, CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/325,023

(22) Filed: Jun. 3, 1999

(51) Int. Cl.[7] ............... H01L 21/44; H01L 21/4763; H01L 21/8238
(52) U.S. Cl. ............... 438/655; 438/657; 438/658; 438/630; 438/233; 438/664; 438/682
(58) Field of Search ............... 438/655, 657, 438/658, 630, 233, 664, 682, 656, 659, 649, 651, 299, 684

(56) References Cited

U.S. PATENT DOCUMENTS

| 4,780,429 | * 10/1988 | Roche et al. | 437/41 |
| 5,731,239 | 3/1998 | Wong et al. | 438/296 |
| 5,953,612 | 9/1999 | Lin et al. | 438/299 |

OTHER PUBLICATIONS

Yukio Fukuda, Shigeto Kohda, and Yoshitaka Kitano, A New Aluminum Pattern Formation Using Substitution Reaction of Aluminum for Polysilicon and Its Application to MOS Device Fabrication, IEEE Transactions on Electron Devices, vol. Ed–31, No. 6, Jun. 1984, pp. 828–832.

* cited by examiner

Primary Examiner—Wael Fahmy
Assistant Examiner—Neal Berezny
(74) Attorney, Agent, or Firm—Monica H. Choi

(57) ABSTRACT

The present invention is a method for fabricating a gate of a MOSFET (Metal Oxide Semiconductor Field Effect Transistor) with the gate having low resistivity. The MOSFET has a drain region, a source region, and a channel region fabricated within a semiconductor substrate, and the MOSFET initially has a gate comprised of a first metal silicide on polysilicon disposed on a gate dielectric over the channel region. Generally, the method of the present invention includes a step of depositing a first dielectric layer over the drain region, the source region, and the gate of the MOSFET. The present invention also includes steps of polishing down the first dielectric layer over the drain region and the source region, and of polishing down the first dielectric layer over the gate until the first metal silicide or the polysilicon of the gate is exposed. The present invention further includes the step of depositing a metal over the first metal silicide if the first metal silicide is exposed or over the polysilicon if the polysilicon is exposed, and of performing a silicidation anneal to form a second metal silicide over a remaining portion of the polysilicon. The thickness of the second metal silicide is a greater than the thickness of the first metal silicide. In this manner, the gate of the present invention has low resistivity since a relatively thick layer of metal silicide is formed on the remaining portion of the polysilicon. In addition, with the present invention, the remaining portion of the polysilicon has a sufficient thickness such that a threshold voltage of the MOSFET is not substantially affected by the second metal silicide disposed on top of the remaining portion of the polysilicon.

9 Claims, 3 Drawing Sheets

METHOD FOR FABRICATION OF A LOW RESISTIVITY MOSFET GATE WITH THICK METAL SILICIDE ON POLYSILICON

TECHNICAL FIELD

This invention relates to MOSFETs (Metal Oxide Semiconductor Field Effect Transistors), and more particularly to a method for fabricating a MOSFET gate with relatively thick metal silicide on polysilicon for a gate with low resistivity.

BACKGROUND OF THE INVENTION

Referring to FIG. 1, a cross sectional view of a conventional MOSFET (Metal Oxide Semiconductor Field Effect Transistor) 100 includes a drain region 102, a source region 104, and a channel region 106 fabricated within a semiconductor substrate 108, as known to one of ordinary skill in the art of electronics. A gate dielectric 110 is disposed over the channel region 106 of the MOSFET 100. The MOSFET 100 also includes a gate comprised of polysilicon 112 disposed over the gate dielectric 110. Spacer structures 113 typically formed of an insulating material surround the gate dielectric 110 and the gate structure over the gate dielectric 110, as known to one of ordinary skill in the art of electronics.

For making contact to the drain region 102, the source region 104, and the polysilicon 112 of the gate, a metal silicide is formed on the drain region 102, the source region 104, and the polysilicon 112 of the gate. A drain silicide 114 is formed on the drain region 102, a source silicide 116 is formed on the source region 104, and a first metal gate silicide 118 is formed on the polysilicon 112 of the gate of the MOSFET 100.

For efficiency in fabrication, the drain silicide 114, the source silicide 116, and the first metal gate silicide 118 are typically fabricated simultaneously in the prior art. During the fabrication of the silicides, the drain region 102, the source region 104, and the polysilicon 112 are exposed, and metal is deposited on those regions. Then, a silicidation anneal is performed, and the drain silicide 114, the source silicide 116, and the first metal gate silicide 118 form from a reaction of the deposited metal with silicon during the silicidation anneal.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, as the dimensions of the MOSFET 100 are scaled down, the depth of diffusion of the drain region 102 and the source region 104 into the semiconductor substrate 108 and the thickness of the polysilicon 112 of the gate are scaled down. Thus, the depth of the drain silicide 114 and the source silicide 116 and the thickness of the first metal gate silicide 118 are also scaled down during simultaneous fabrication of the drain silicide 114, the source silicide 116, and the first metal gate silicide 118.

However, such scaling down of the thickness of the first metal gate silicide 118 results in higher resistivity of the gate of the MOSFET 100. Such higher resistivity in turn leads to slower device speed of the MOSFET 100. Nevertheless, scaling down the dimensions of the MOSFET 100 is also advantageous.

Thus, a method is desired for fabricating a gate with low resistivity within such a MOSFET with scaled down dimensions.

SUMMARY OF THE INVENTION

Accordingly, the present invention is a method for fabricating a gate of a MOSFET (Metal Oxide Semiconductor Field Effect Transistor) with the gate having low resistivity. The MOSFET has a drain region, a source region, and a channel region fabricated within a semiconductor substrate, and the MOSFET initially has a gate comprised of a first metal silicide on polysilicon disposed on a gate dielectric over the channel region. Generally, the method of the present invention includes a step of depositing a first dielectric layer over the drain region, the source region, and the gate of the MOSFET. The present invention also includes steps of polishing down the first dielectric layer over the drain region and the source region, and of polishing down the first dielectric layer over the gate until the first metal silicide on the polysilicon or the polysilicon of the gate is exposed. The present invention further includes a step of depositing a metal on the first metal silicide that is exposed or on the polysilicon that is exposed. A silicidation anneal is then performed to react the metal with the polysilicon to form a predetermined thickness of a second metal silicide over a remaining portion of the polysilicon. The predetermined thickness of the second metal silicide is greater than a thickness of the first metal silicide to result in a MOSFET gate with low resistivity. In addition, the present invention includes the step of removing any portion of the metal that is not reacted during the silicidation anneal.

In this manner, the gate of the present invention has low resistivity since a relatively thick layer of the second metal silicide is formed on the remaining portion of the polysilicon. However, with the present invention, the remaining portion of the polysilicon has a sufficient thickness such that a threshold voltage of the MOSFET is not significantly affected by the second metal silicide disposed on top of the remaining portion of the polysilicon. The present invention may be used to particular advantage for fabricating a gate with low resistivity for a MOSFET with scaled down dimensions.

These and other features and advantages of the present invention will be better understood by considering the following detailed description of the invention which is presented with the attached drawings.

The figures referred to herein are drawn for clarity of illustration and are not necessarily drawn to scale. Moreover, the figures referred to herein show a MOSFET that is typically part of a larger integrated circuit. Elements having the same reference number in FIGS. 1, 2, 3, 4, 5, 6, 7, and 8 refer to elements having similar structure and function.

DETAILED DESCRIPTION

Figure 1:
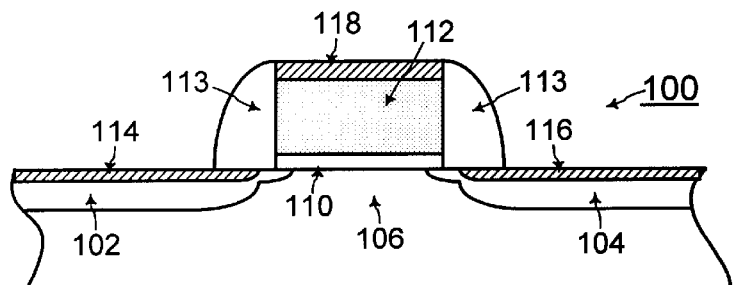
FIG. 1 shows a cross sectional view of a conventional MOSFET of the prior art.
Figure 2:
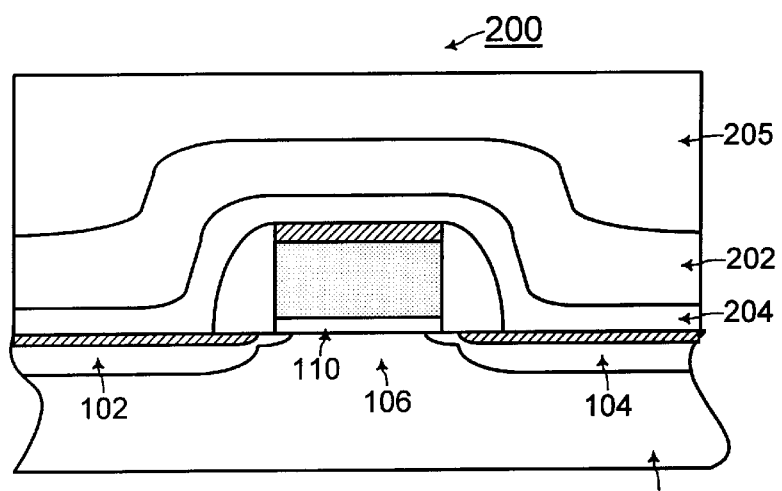
FIG. 2 shows a cross sectional view of a MOSFET of the present invention, with deposition of a first dielectric layer for fabricating a gate with low resistivity, according to an embodiment of the present invention.

Referring to FIG. 2, the method for fabricating a gate with low resistivity for a MOSFET 200 of the present invention includes the step of depositing a first dielectric layer 202 over the surfaces of the semiconductor substrate 108. The MOSFET 200 has device regions that are similar to the device regions of the MOSFET 100 of FIG. 1 with the same reference number. The first dielectric layer 202 is comprised of a dielectric material such as silicon dioxide. The first dielectric layer 202 is deposited over the drain region 102, the source region 104, and the gate of the MOSFET 200.

Referring to FIG. 2, in an alternative embodiment of the present invention, a dielectric etch stop layer 204 may be deposited before the first dielectric layer 202 is deposited. The dielectric etch stop layer 204 may be needed for subsequent fabrication steps after the fabrication of the low resistivity gate of the present invention. The dielectric etch stop layer 204 may be comprised of silicon oxynitride for example. However, the present invention may be practiced without deposition of the dielectric etch stop layer 204 and with deposition of only the first dielectric layer 202, as would be apparent to one of ordinary skill in the art of integrated circuit fabrication from the description herein. Processes for deposition of the dielectric material of the first dielectric layer 202 and the dielectric etch stop layer 204 are known to one of ordinary skill in the art of integrated circuit fabrication.

Figure 3:
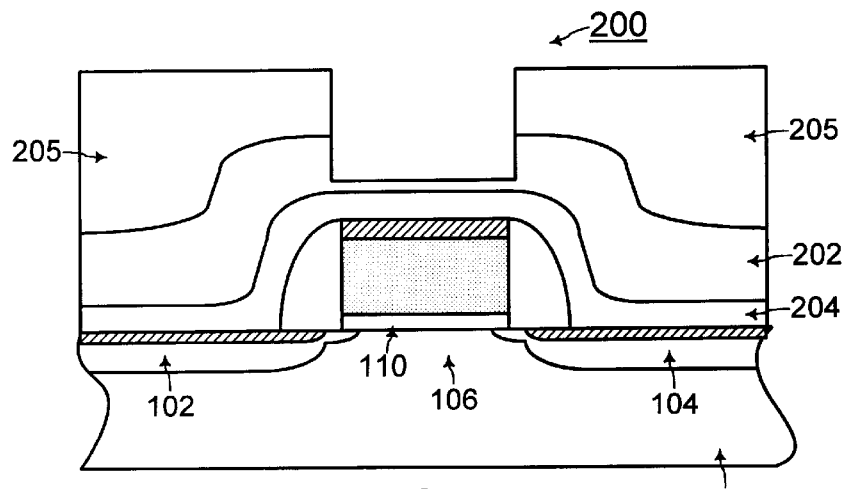
FIG. 3, shows a cross sectional view of the MOSFET of FIG. 2, with patterning and etching of the first dielectric layer of FIG. 2 for a reverse planarization of the first dielectric layer before polishing of the first dielectric layer, according to an embodiment of the present invention.

Referring to FIGS. 2 and 3, a photoresist layer 205 is deposited over the first dielectric layer 202. The photoresist layer 205 is patterned with a masking step to etch the first dielectric layer 202 over the gate of the MOSFET 202 as shown in FIG. 3. The photoresist layer 205 is then removed before a subsequent polishing of the first dielectric layer 202. Such a patterning and etching of the first dielectric layer 202 is a reverse planarization process that creates peaks in the first dielectric layer 202 which is amenable for the subsequent polishing of the first dielectric layer 202. Processes for thus patterning and etching a portion of the first dielectric layer 202 are known to one of ordinary skill in the art of integrated circuit fabrication. In an alternative embodiment of the present invention, this patterning and etching of the first dielectric layer 202 may not be performed before the subsequent polishing of the first dielectric layer 202.

Figure 4:
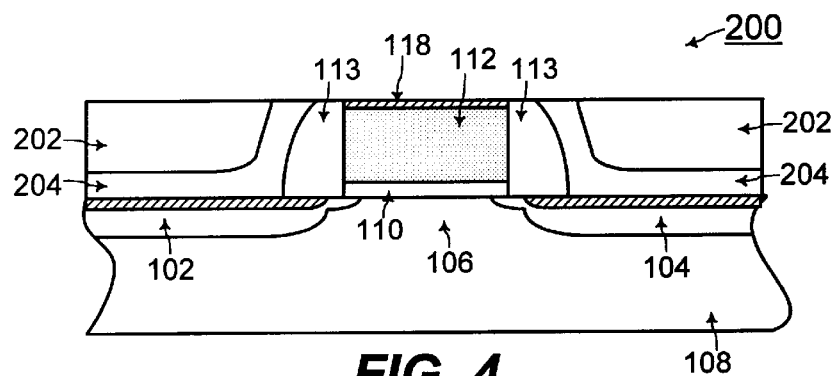
FIG. 4 shows a cross sectional view of the MOSFET of FIG. 3, with polishing down of the first dielectric layer until a first metal silicide or the polysilicon of the gate is exposed, according to an embodiment of the present invention.

Referring to FIG. 4, the top surface of the structures on the semiconductor substrate 108 of FIG. 3 is polished down. Thus, the first dielectric layer over the drain region 102 and the source region 104 is polished down. In addition, referring to FIGS. 1 and 4, the first dielectric layer 202 over the gate of the MOSFET 200 is polished down until the first metal gate silicide 118 is exposed. Alternatively, the present invention may be practiced when the first dielectric layer 202 and the first metal gate silicide 118 are further polished down until the polysilicon 112 is exposed. Processes for thus polishing the top surface of the structures on the semiconductor substrate 108, such as chemical mechanical polishing, are known to one of ordinary skill in the art of integrated circuit fabrication.

Referring to FIG. 4, with the first metal gate silicide 118 or the polysilicon 112 exposed, in one embodiment of the present invention, the polysilicon 112 may be doped using low energy implantation. For example, if the MOSFET 200 were an N-channel MOSFET, the polysilicon 112 may have insufficient dopant resulting in detrimental effects on the threshold voltage of the MOSFET 200 from depletion of the polysilicon 112. In such a case, the polysilicon 112 may be doped with an N-type dopant using low energy implantation. Processes for thus selectively doping the polysilicon 112 using low energy implantation are known to one of ordinary skill in the art of integrated circuit fabrication.

Figure 5:
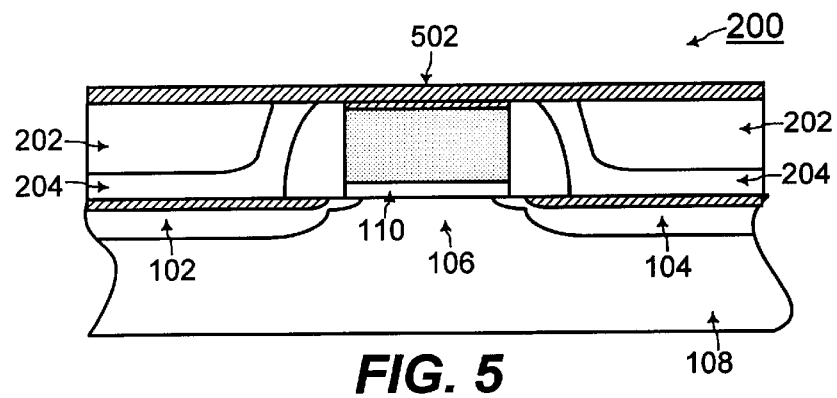
FIG. 5 shows a cross sectional view of the MOSFET of FIG. 4, with deposition of a metal on the first metal silicide that is exposed or on the polysilicon that is exposed, according to an embodiment of the present invention.

Referring to FIG. 5, a metal layer 502 is deposited to cover the first metal gate silicide 118 that is exposed. Alternatively, if the polysilicon 112 is exposed, then the metal layer 502 is deposited to cover the polysilicon 112 that is exposed. The metal layer 502 may include cobalt that is deposited before another deposition of another type of metal such as nickel, titanium, or platinum. Processes for thus depositing the metal layer 502, as shown in FIG. 5, are known to one of ordinary skill in the art of integrated circuit fabrication.

Figure 6:
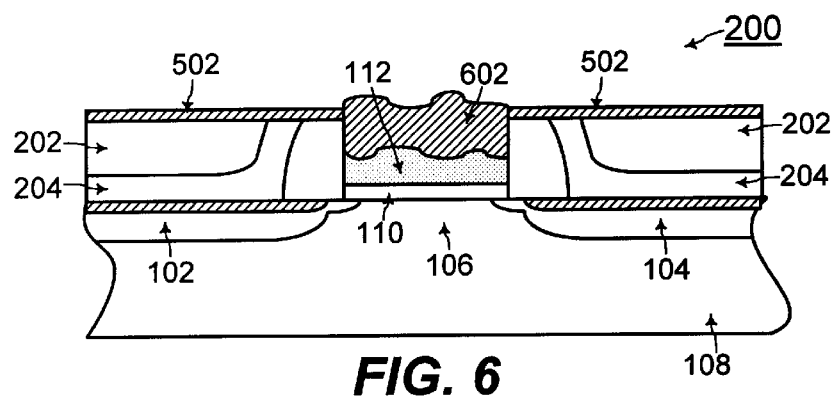
FIG. 6 shows a cross sectional view of the MOSFET of FIG. 5, after a silicidation anneal for forming a relatively thick layer of a second metal silicide over a remaining portion of the polysilicon of the MOSFET gate, according to an embodiment of the present invention.

Referring to FIG. 6, a first silicidation anneal is performed for forming a second metal silicide 602 over a remaining portion of the polysilicon 112. During this first silicidation anneal, the metal 502 reacts with the polysilicon 112 to form a predetermined thickness of the second metal silicide 602. The predetermined thickness of the second metal silicide 602 is greater than the thickness of the first metal silicide 118 that is typically formed during the silicidation anneal for the drain silicide 114 and the source silicide 116. Processes for performing a silicidation anneal are known to one of ordinary skill in the art of integrated circuit fabrication.

Figure 7:
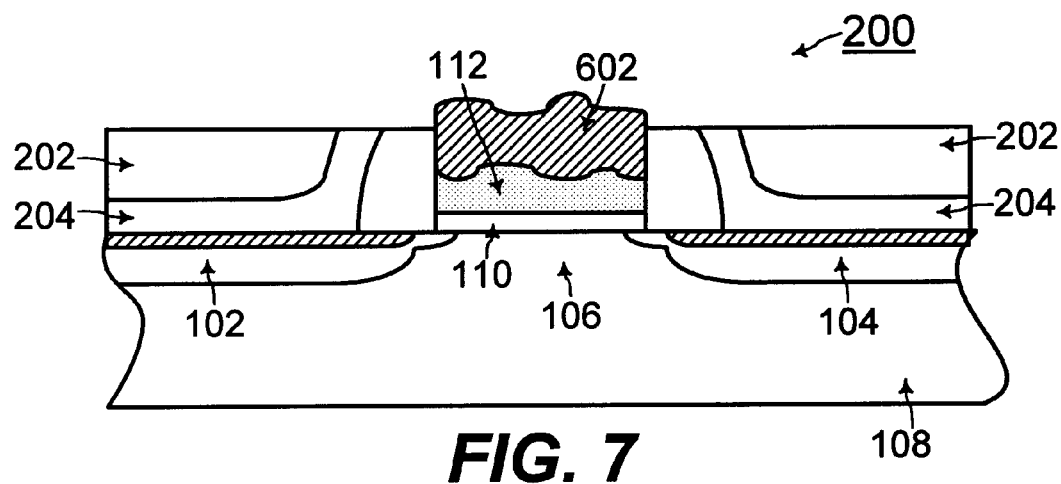
FIG. 7 shows a cross sectional view of the MOSFET of FIG. 6, with removal of any portion of metal that is not reacted during the silicidation anneal, according to an embodiment of the present invention.

Referring to FIG. 7, any portion of the metal layer 502 that is not reacted during the silicidation anneal is removed. Processes for etching off such unreacted metal are known to one of ordinary skill in the art of integrated circuit fabrication.

For some metals that are deposited as part of the metal layer 502, a second silicidation anneal is performed to convert the second metal silicide to a desired phase. For example, when cobalt is included within the metal layer 502, the first silicidation anneal may produce cobalt silicide (CoSi) as part of the second metal silicide 602. However, cobalt disilicide ($CoSi_2$) is the desired phase of the second metal silicide 602 because cobalt disilicide ($CoSi_2$) is more conductive than cobalt silicide (CoSi). The second silicidation anneal converts the second metal silicide 602 to have the more conductive desired phase of cobalt disilicide ($CoSi_2$). However, for some metals, the first silicidation anneal may result in the desired phase of the second metal silicide 602, and the second silicidation anneal may not be needed.

Figure 8:
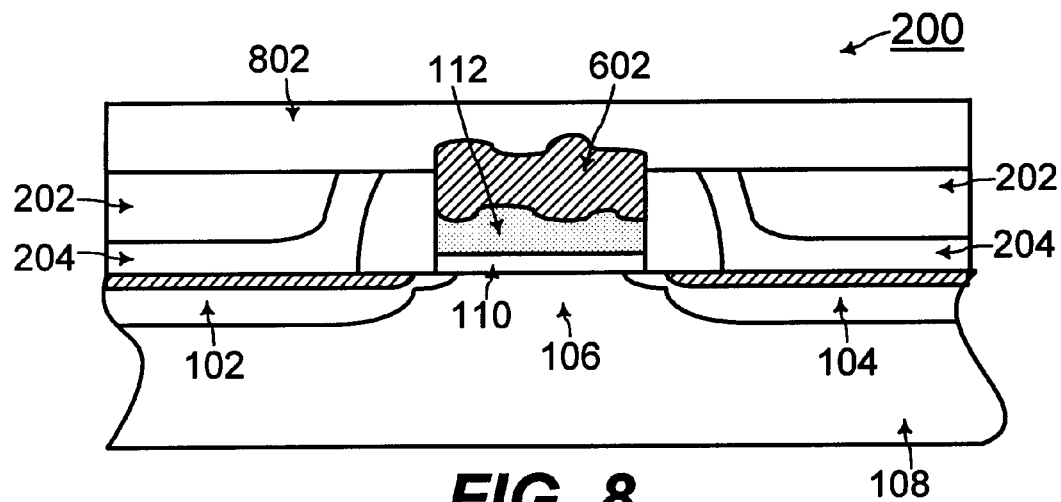
FIG. 8 shows a cross sectional view of the MOSFET of FIG. 7, with deposition of a second dielectric layer over the MOSFET of the present invention before forming metal interconnect to the second metal silicide of the MOSFET gate, according to an embodiment of the present invention.

Referring to FIG. 8, a second dielectric layer 802 is deposited over the second metal silicide 602 and over any surrounding dielectric layer including the first dielectric layer 202. The second dielectric layer 802 may be comprised of silicon dioxide, and processes for thus depositing the second dielectric layer 802 are known to one of ordinary skill in the art of integrated circuit fabrication. At this point, after deposition of the second dielectric layer 802, standard integrated circuit fabrication processes are used for forming local metal interconnect to the active device areas of the MOSFET including the second metal silicide 602 of the gate of the MOSFET 200.

In this manner, the gate of the MOSFET 200 of the present invention includes a relatively thick layer of the second metal silicide 602 disposed over the remaining portion of the polysilicon 112. Thus, because a significant amount of the second metal silicide 602 having relatively high conductivity forms the gate of the MOSFET 200 of the present invention, such a gate has low resistivity. Referring to FIGS. 1 and 8, the amount of the second metal silicide 602 is significantly greater than the amount of first metal silicide 118 that is formed during the silicidation anneal for the drain silicide 114 and the source silicide 116 for the MOSFET 200 having scaled down dimensions.

However, the remaining portion of the polysilicon 112 still abuts the gate dielectric 110 to preserve the threshold voltage of the MOSFET 200. In addition, the remaining portion of the polysilicon 112 has a sufficient thickness such that a first work function of the remaining portion of the polysilicon 112 over the gate dielectric 110 is not substantially affected by a second work function of the second metal silicide 602 on top of the remaining portion of the polysilicon 112. Thus, the threshold voltage of the MOSFET 200 of the present invention is not noticeably altered by the processes of the present invention.

The foregoing is by way of example only and is not intended to be limiting. As will be understood by those skilled in the art, the integrated circuit structures described herein may be made or used in the same way regardless of their position and orientation. Accordingly, it is to be understood that terms and phrases such as "bottom wall," "sidewall," "down," "on," "over," and "top" as used herein refer to the relative location and orientation of various portions of the structures with respect to one another, and are not intended to suggest that any particular absolute orientation with respect to external objects is necessary or required.

The invention is limited only as defined in the following claims and equivalents thereof.

I claim:

1. A method for fabricating a gate of a MOSFET (Metal Oxide Semiconductor Field Effect Transistor) with said gate having low resistivity, said MOSFET having a drain region, a source region, and a channel region fabricated within a semiconductor substrate, and said MOSFET initially having a gate comprised of a first metal silicide on polysilicon disposed on a gate dielectric over said channel region, the method including steps of:

A. depositing a first dielectric layer over said drain region, said source region, and said gate;

B. etching away a portion of said first dielectric layer by patterning a photoresist layer deposited on said first dielectric layer to form additional peaks in said first dielectric layer from said etching away of said portion of said first dielectric layer near said gate, and then polishing down said first dielectric layer over said drain region and said source region, and polishing down said first dielectric layer over said gate until one of said first metal silicide on said polysilicon and said polysilicon of said gate is exposed;

C. depositing a metal on said first metal silicide if said first metal silicide is exposed in said step B, and depositing said metal on said polysilicon if said polysilicon is exposed in said step B;

D. performing a silicidation anneal to react said metal with said polysilicon to form a predetermined thickness of a second metal silicide over a remaining portion of said polysilicon, said predetermined thickness of said second metal silicide being greater than a thickness of said first metal silicide; and E. removing any portion of said metal that is not reacted during said silicidation anneal of said step D.

2. The method of claim 1, further including a step of:

performing a second silicidation anneal to convert said second metal silicide to a desired phase.

3. The method of claim 1, further including a step of:

depositing an etch stop layer over said drain region, said source region, and said gate before said step A of depositing said first dielectric layer over said etch stop layer.

4. The method of claim 1, further including a step of:

depositing a second dielectric layer over said first dielectric layer and over said second metal silicide and forming metal interconnect to said second metal silicide.

5. The method of claim 1, further including a step of:

implanting dopant into said polysilicon after said step B and before said step C.

6. The method of claim 1, wherein said metal deposited in said step C includes cobalt.

7. The method of claim 6, wherein said metal deposited in said step C is further selected from a group consisting of nickel, titanium, and platinum.

8. The method of claim 1, wherein said remaining portion of said polysilicon has a sufficient thickness such that a threshold voltage of said MOSFET is not substantially affected by said second metal silicide disposed on top of said remaining portion of said polysilicon.

9. A method for fabricating a gate of a MOSFET (Metal Oxide Semiconductor Field Effect Transistor) with said gate having low resistivity, said MOSFET having a drain region, a source region, and a channel region fabricated within a semiconductor substrate, and said MOSFET initially having a gate comprised of a first metal silicide on polysilicon disposed on a gate dielectric over said channel region, the method including steps of:

A. depositing an etch stop layer over said drain region, said source region, and said gate;

B. depositing a first dielectric layer over said etch stop layer;

C. etching away a portion of said first dielectric layer by patterning a photoresist layer deposited on said first dielectric layer to form additional peaks in said first dielectric layer from said etching away of said portion of said first dielectric layer near said gate;

D. polishing down said first dielectric layer over said drain region and said source region, and polishing down said first dielectric layer over said gate until one of said first metal silicide on said polysilicon and said polysilicon of said gate is exposed;

E. implanting dopant into said polysilicon;

F. depositing a metal on said first metal silicide if said first metal silicide is exposed in said step D, and depositing said metal on said polysilicon if said polysilicon is exposed in said step D;

G. performing a silicidation anneal to react said metal with said polysilicon to form a predetermined thickness of a second metal silicide over a remaining portion of said polysilicon, said predetermined thickness of said second metal silicide being greater than a thickness of said first metal silicide;

H. removing any portion of said metal that is not reacted during said silicidation anneal of said step G;

I. performing a second silicidation anneal to convert said second metal silicide to a desired phase;

J. depositing a second dielectric layer over said first dielectric layer and over said second metal silicide; and K. forming metal interconnect to said second metal silicide;

and wherein said remaining portion of said polysilicon has a sufficient thickness such that a threshold voltage of said MOSFET is not substantially affected by said second metal silicide disposed on top of said remaining portion of said polysilicon.

* * * * *